United States Patent
Le et al.

(10) Patent No.: US 7,388,890 B2
(45) Date of Patent: Jun. 17, 2008

(54) PIEZOELECTRIC-TUNED EXTERNAL CAVITY LASER

(75) Inventors: Lam Thanh Le, Fremont, CA (US); Wade Wai-Chung Tang, San Jose, CA (US); Guangzhi Z. Zhang, San Jose, CA (US)

(73) Assignee: Bookham Technology PLC, Northamptonshire (GB)

( * ) Notice: Subject to any disclaimer, the term of this patent is extended or adjusted under 35 U.S.C. 154(b) by 501 days.

(21) Appl. No.: 11/011,461

(22) Filed: Dec. 13, 2004

(65) Prior Publication Data
US 2005/0243875 A1    Nov. 3, 2005

Related U.S. Application Data

(60) Provisional application No. 60/529,001, filed on Dec. 12, 2003.

(51) Int. Cl.
*H01S 3/10* (2006.01)
(52) U.S. Cl. .............................. 372/20; 372/103; 372/9
(58) Field of Classification Search ................ 372/103, 372/20
See application file for complete search history.

(56) References Cited

U.S. PATENT DOCUMENTS

| | | | |
|---|---|---|---|
| 5,995,521 A | | 11/1999 | Moore et al. |
| 6,614,829 B1 * | | 9/2003 | Tuganov et al. ............ 372/107 |
| 2004/0165640 A1 * | | 8/2004 | Clifford et al. ............... 372/97 |

* cited by examiner

*Primary Examiner*—Dung T Nguyen
(74) *Attorney, Agent, or Firm*—Morrison & Foerster LLP

(57) ABSTRACT

A tunable laser comprising: a foundation including a first side and an oppositely facing second side and including a hole extending from the first side to the second side; a tuning assembly including a base, a fine tuning arm and a rotational flex bearing disposed adjacent the first side of the foundation; wherein the base is disposed adjacent to the first side of the foundation; wherein one end of the flex bearing is secured to the base; wherein the other end of the flex bearing is secured to the fine tuning arm; wherein a portion of the fine tuning arm extends at least partially into the hole; an external cavity laser including a gain medium, a dispersion medium and a reflective member disposed adjacent to the second side of the foundation; wherein the gain medium and the dispersion medium grating are secured in a fixed relation relative to the each other; wherein the reflective member is secured to the portion of the arm extending into the hole; and a piezoelectric device with one end secured to the base and another end secured to the arm.

21 Claims, 6 Drawing Sheets

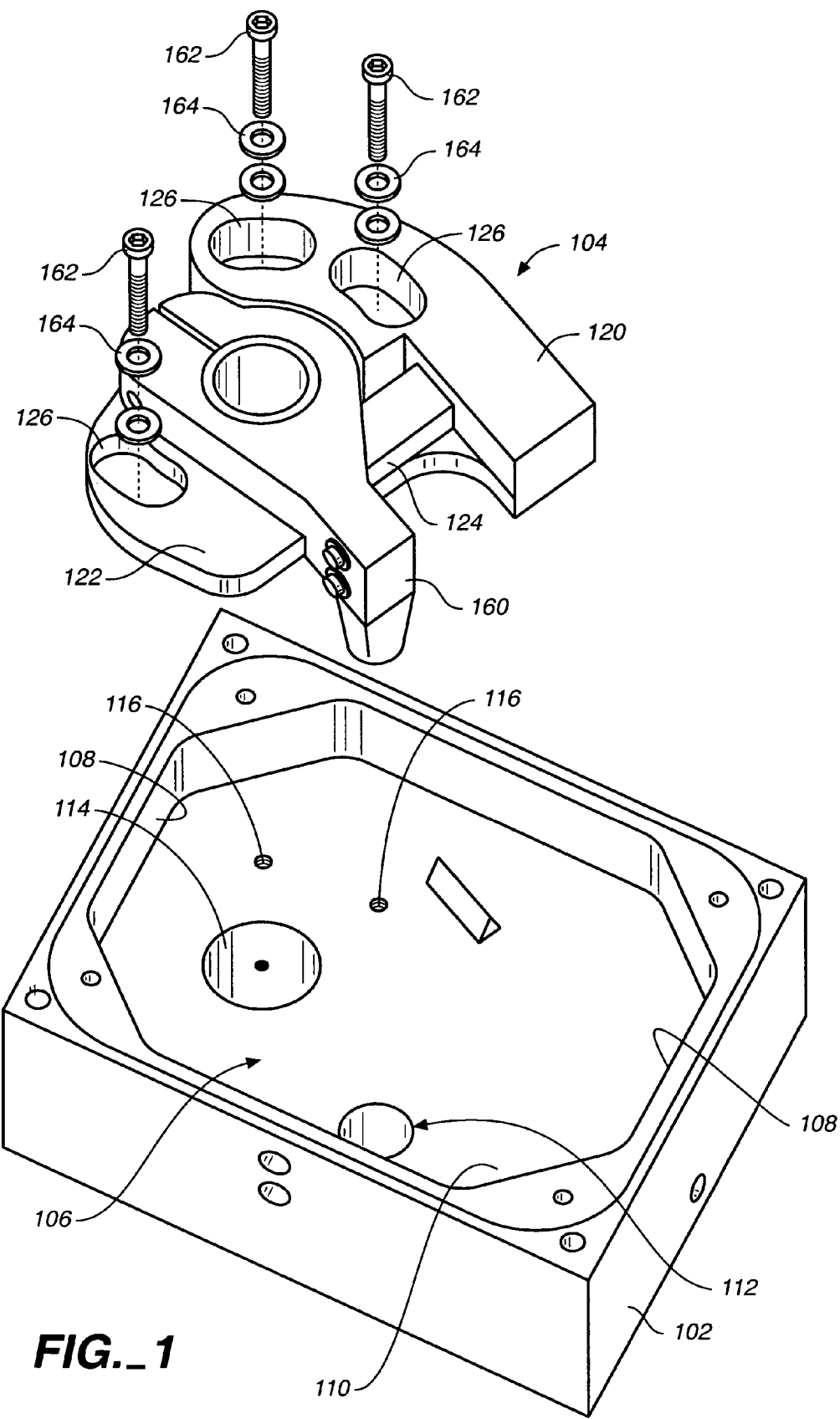
FIG._1

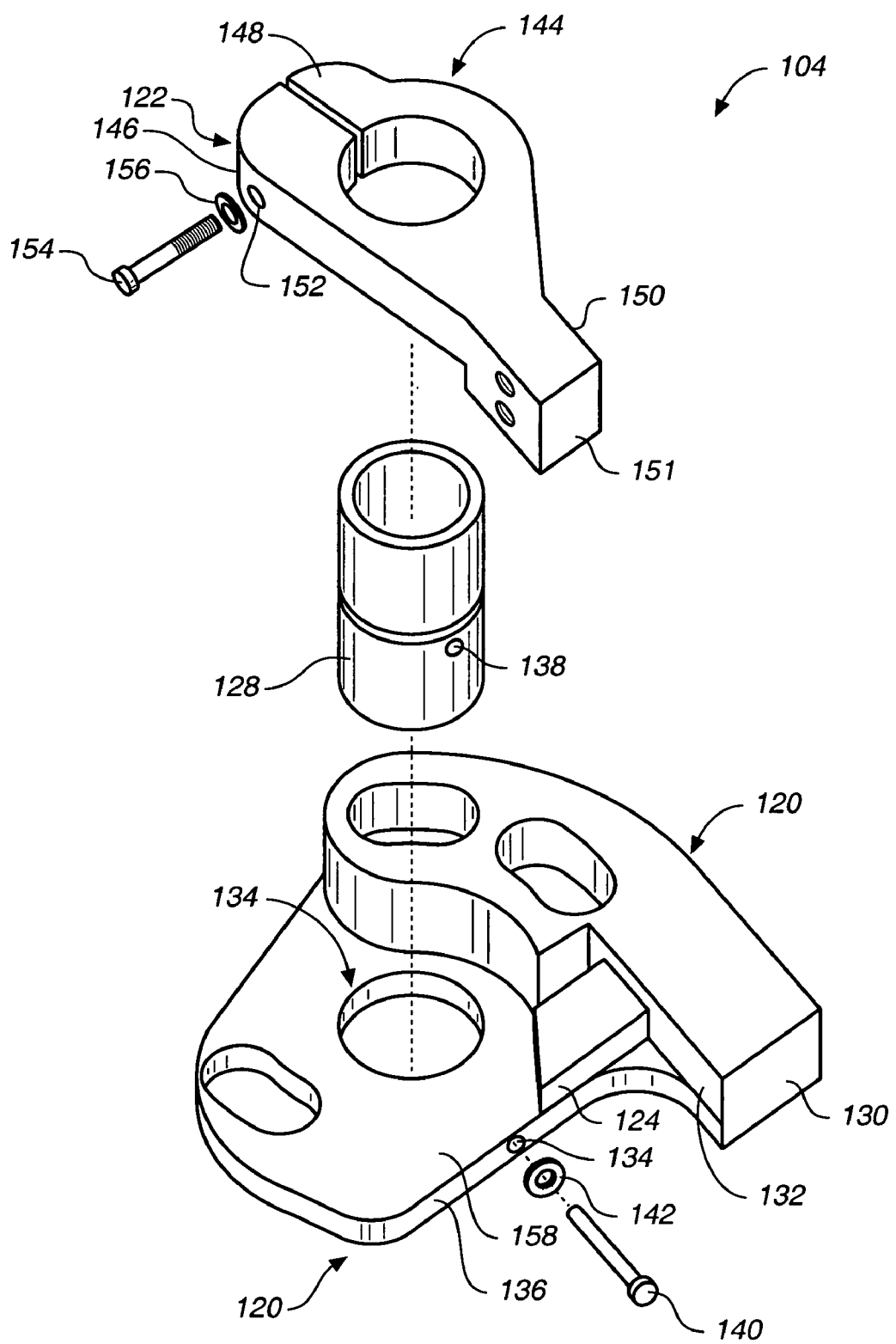
FIG._2

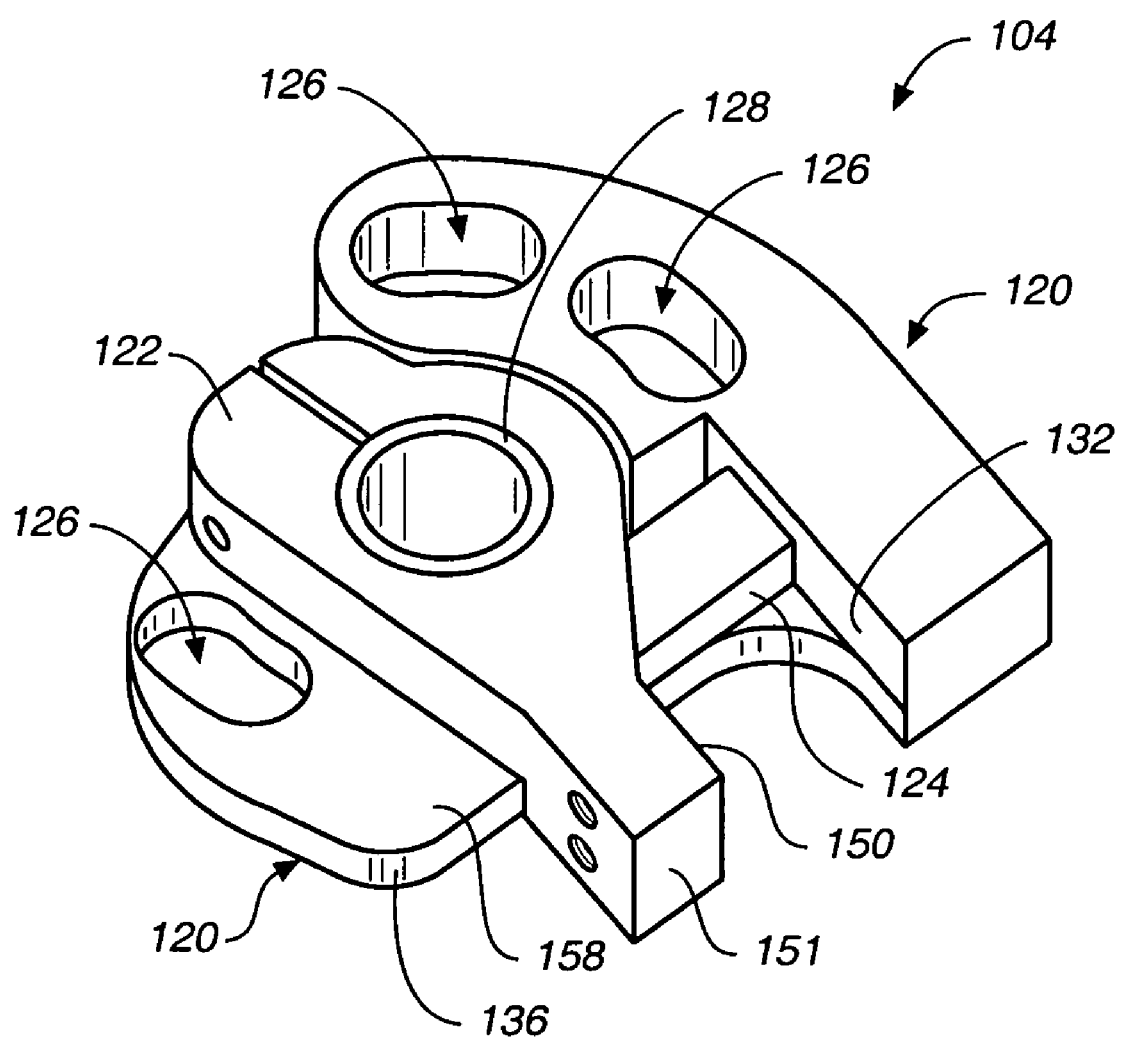
FIG._3

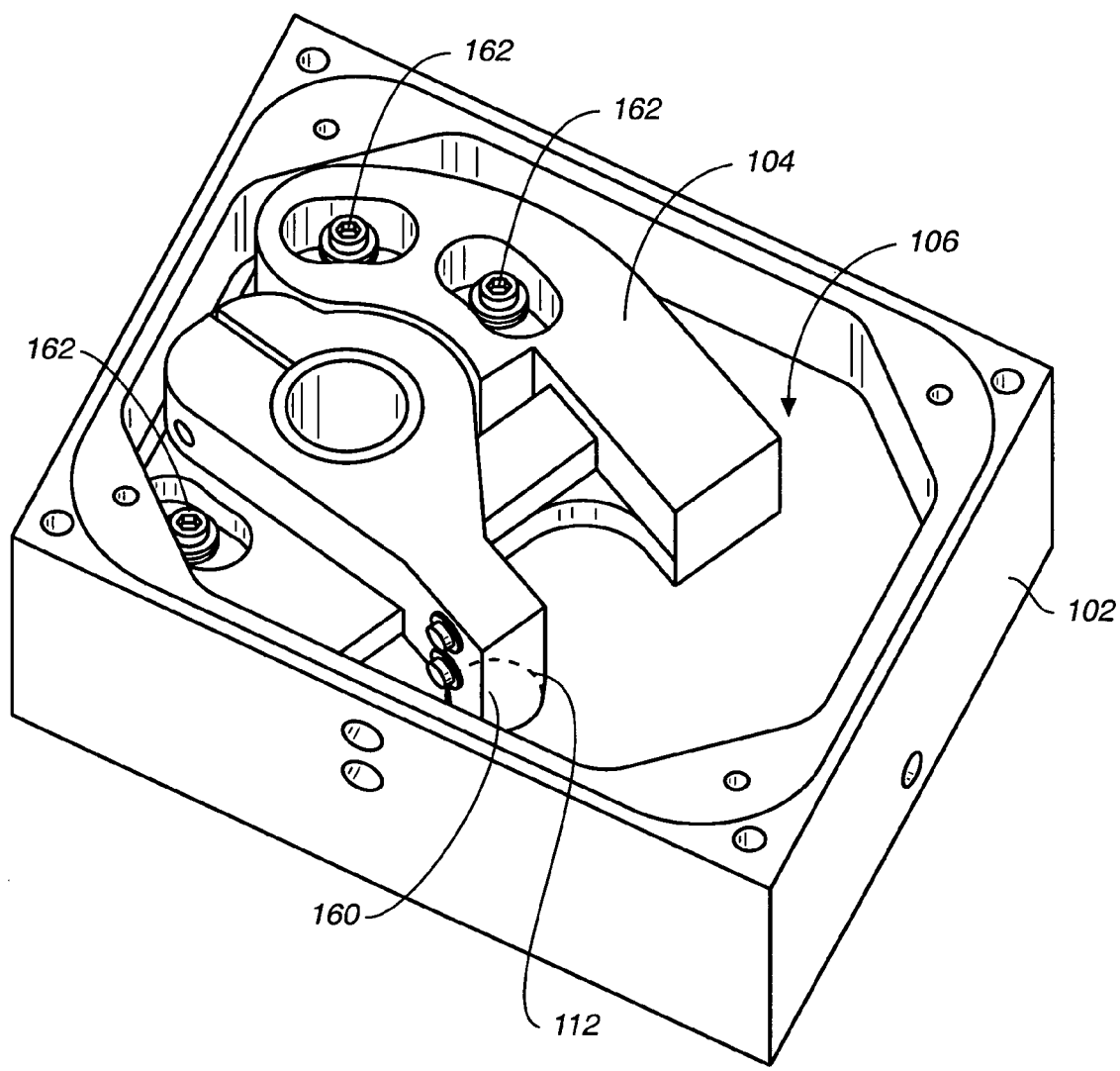
FIG._4

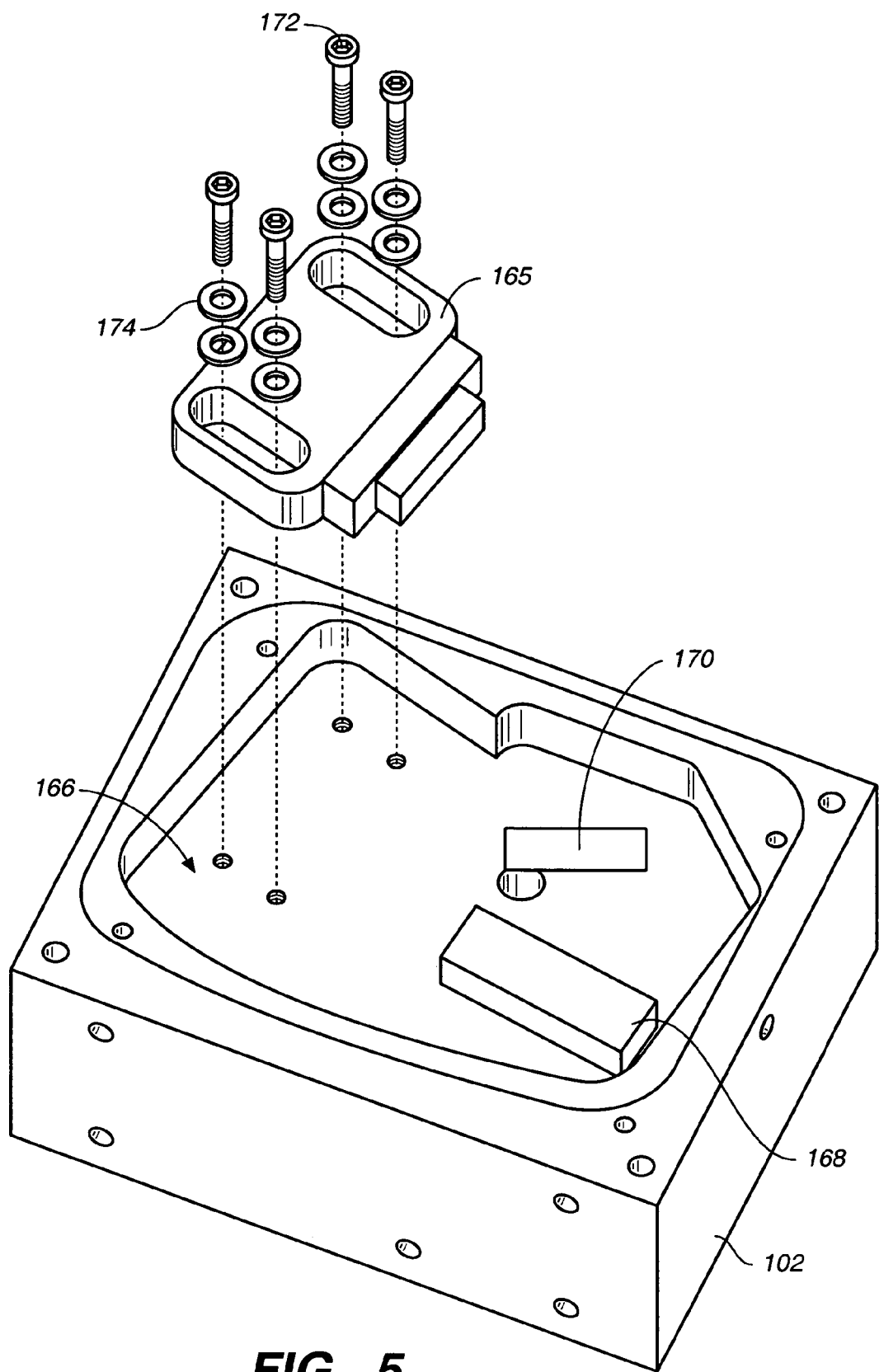
FIG._5

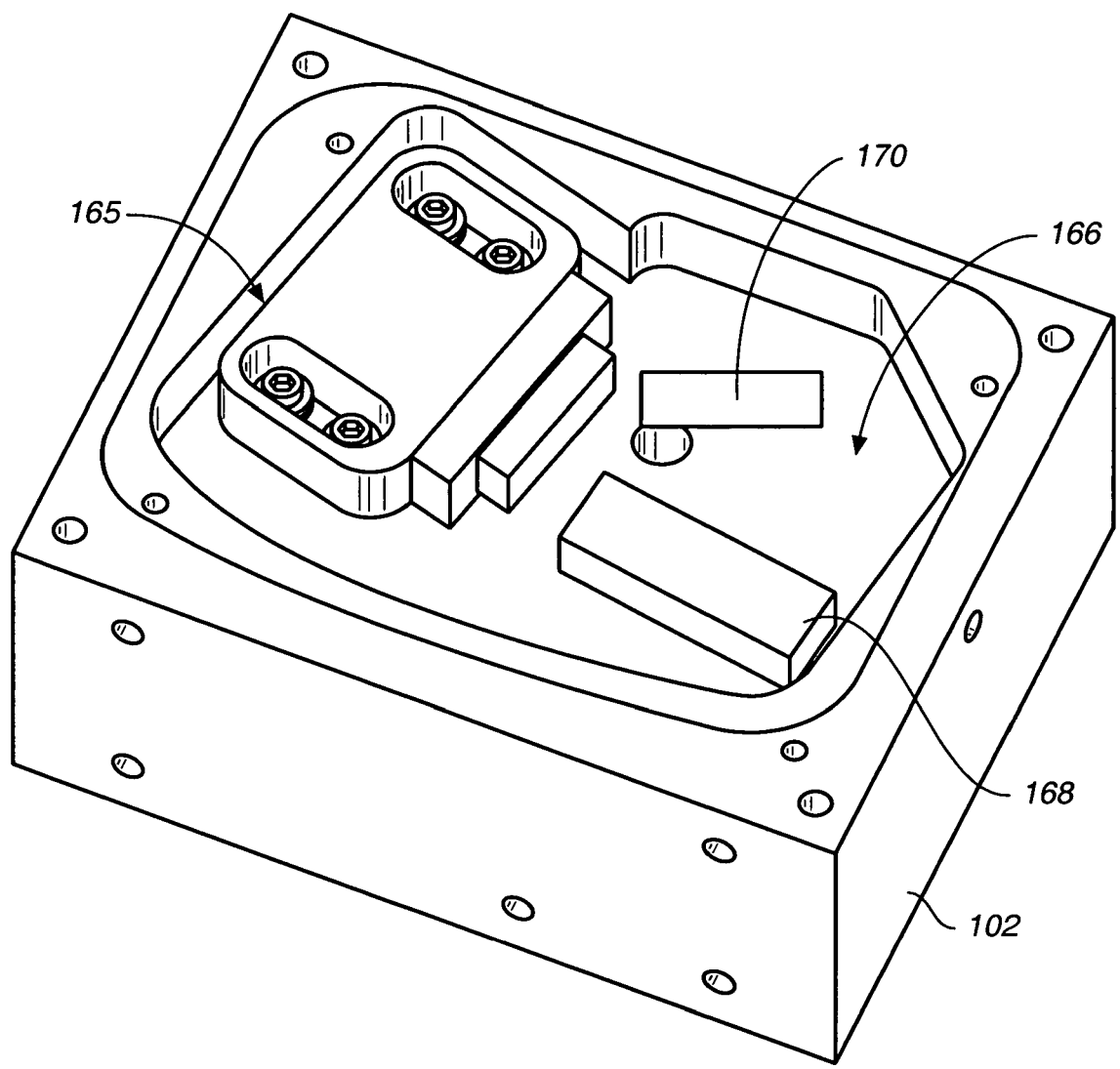
FIG._6

PIEZOELECTRIC-TUNED EXTERNAL CAVITY LASER

BACKGROUND OF THE INVENTION

The earlier 6000 Vortex Series Tunable Diode Laser, produced by New Focus Corp. of San Jose, Calif., employs a laser cavity based on the Littman-Metcalf design, which uses a diffraction grating at grazing incidence, together with a tuning reflector, to provide wavelength selectivity. Essential to the performance of tunable external-cavity diode lasers (ECDLs) is a high-quality anti-reflection (AR) coating on the front facet of the diode. The AR coating turns the diode into purely a gain element. A collimating lens directs the output of the diode across a diffraction grating at grazing incidence. The end mirror of the laser cavity reflects the first-order diffraction off the grating to provide feedback. Dispersion provided by the grating allows only one cavity mode to lase, resulting in a very narrow linewidth. The specular reflection or zero-order diffraction off the grating serves as the output beam of the laser.

The angle between the grating and the end mirror determines the lasing wavelength. Tuning is achieved by varying the angle using a piezoelectric actuator to rotate the end mirror. Continuous (mode-hop-free) tuning requires selecting an appropriate rotation point, also called a pivot point. Discontinuous tuning, characterized by period "mode-hops" results from two competing wavelength-selection constraints, the mirror-grating angle and the laser-cavity length. The laser-cavity length, L, defines a discrete set of possible wavelengths or modes, $\lambda_N$, that can lase, given by the equation $L=N\lambda_N/2$, (N=integer). The grating equation insists that $m\lambda=\Lambda(\sin\theta_i+\sin\theta_d)$, where m stands for the grating diffraction orders. $\Lambda$ refers to the groove spacing of the grating while $\theta_i$ and $\theta_d$ refer to the incident and diffracted angles of the laser beam. Rotation of the tuning reflector causes parameters in both equations to change. An appropriately selected point of rotation synchronizes the two, such that the cavity length remains the same number of half-wavelengths long as the tuning reflector is rotated. Thus mode-hop free tuning is achieved. When this condition is not met, the lasing wavelength will periodically hop from one mode to the next (e.g., from N to N+1).

U.S. Pat. No. 5,995,521, entitled External Cavity Laser Pivot Design, invented by Moore et al., discloses an external cavity diode laser (ECDL) with a pivot point design that is inexpensive and precise and that allows for simultaneous rotary and lineal motion. A housing for a tunable external cavity laser including a gain medium, a reflector, and a dispersive element is disclosed. The housing includes a base section, a motion section and an actuator. Glue is used to secure together certain non-movable parts. The gain medium and a diffractor are mounted to the base section such that a first energy beam emanating from the gain medium strikes the dispersive element and leaves the dispersive element as a second beam at an angle with respect to the first beam which depends on wavelength. A reflector is conditioned on the motion section to reflect the second beam to the gain medium via the dispersive element. The motion section is supported by the base about a torsional member, which defines a rotational axis for minor movement. The actuator is in selectively engagable abutment against the motion section to move the reflector with respect to the dispersive element about the torsional member to tune the external cavity laser.

While this arrangement generally has been successful, there has been a need for an improved laser tuning mechanism and for an associated tunable external cavity laser system. More particularly, there has been a need for an improved tuning mechanism for continuous tuning without mode-hop, which can provide fine increment control of wavelength, and that is simple and cost-effective in design. For example, there has been a need for a rotational axis which is subject to better control than that defined by the torsional member. Moreover, there has been a need for an improved design that provides stability of laser wavelength tuning even in harsh environments such as the ones with high or low temperatures, pressure variation or humidity change. There also has been a need for such a laser tuning mechanism and associated external cavity laser system that is suitable for the vacuum environment for outer space. It will be appreciated that the use of glue may be unsuitable in a vacuum environment due to outgassing. The present invention meets these needs.

SUMMARY OF THE INVENTION

In one embodiment, for example, the invention provides a laser tuning apparatus that includes a base and a fine tuning arm secured to the first base for rotation about a pivot axis. An actuator is operatively coupled to provide a twisting torque force to urge the arm in a rotational direction about the pivot axis. At least one spring is operatively connected to urge the arm to a neutral position relative to the pivot axis in the absence of a twisting torque force.

In another embodiment, the apparatus is part of a tunable laser that further includes a laser cavity including a reflecting surface operatively coupled to the arm, a dispersive surface disposed in a fixed position relative to the pivot axis and a gain medium disposed in a fixed position relative to the pivot axis. In one embodiment, the pivot axis is disposed for mode-hop-free tuning of the laser cavity.

Thus, the present invention provides reliable, accurate, controllable rotation of the tuning arm, even in vacuum environments and harsh environments such as outer space, for example.

BRIEF DESCRIPTION OF THE DRAWINGS

FIG. 1 is an illustrative top perspective partially exploded view of a foundation block and a tuning assembly of an embodiment of the invention.

FIG. 2 is an illustrative perspective exploded view of the laser tuning assembly in accordance with the embodiment of FIG. 1.

FIG. 3 is an illustrative perspective non-exploded view of the laser tuning assembly of FIG. 2, which shows how its various parts fit together.

FIG. 4 is a top perspective view showing the laser tuning assembly secured within a top recessed region of the foundation block in accordance with the embodiment of FIGS. 1-3.

FIG. 5 is an illustrative partially exploded top perspective view showing a bottom side of the foundation block and a laser diode block, which is to be secured within a bottom recessed region of the foundation block of FIG. 1.

FIG. 6 is an illustrative bottom perspective view of an external cavity laser assembly in accordance with the embodiment of FIG. 5.

DETAILED DESCRIPTION OF THE PREFERRED EMBODIMENT

A present embodiment of the invention provides a frequency tunable external cavity laser with piezoelectric transducer as an actuator for continuous laser frequency tuning, i.e., tuning with no mode hopping across the designed tuning range of this invention. A piezoelectric transducer is coupled to a flex bearing so as to allow stable movement of the tuning reflector, or the feedback prism illustrated by the description of drawings to achieve well-controlled frequency tuning.

The embodiment includes a light emission source that acts as a gain medium for lasing and light amplification, dispersion optics that select a single longitudinal cavity mode of frequency out of the light spectrum from the light emission source, a tuning reflector to feed and tune the selected frequency back to the gain medium for further amplification to produce the laser radiation, and a device that uses a piezoelectric transducer and a flexible bearing to drive the tuning reflector around a pivot and provide the stable and continuous tuning of laser wavelength. The flexible bearing is a centric type of rotation device to provide a pivot for rotation of the tuning reflector by the piezoelectric transducer. The pivot location is designed in a way that when the laser frequency is tuned with the tuning reflector rotation, the cavity length is also tuned to synchronize the change of wavelength in accordance with the above-described cavity length equation and the grating equation. As a result, the selected cavity mode is locked to a constant mode and its frequency is continuously tuned without mode hopping.

The piezoelectric transducer in conjunction with the flexible bearing provides a quiet and stable driving device for wavelength tuning for such external cavity lasers. The flexible bearing confines the pivot so as to eliminate the mode hops, and the piezoelectric transducer controls the laser frequency with very fine wavelength tuning increment. This fine control of the wavelength results from the precise translation movement of the piezoelectric transducer.

FIG. 1 is an illustrative top perspective partially exploded view of a foundation block 102 and a tuning assembly 104. The foundation block 102, also referred to herein as a second base, defines a top recessed region 106 with upstanding sidewalls 108 that surround a top surface 110. A hole 112 is formed in the top surface 110 and is sized to permit a downward depending reflector support structure 160 to extend therethrough and to move transverse to the plane of the top surface 110 so as to move a reflector for fine tuning of lasing wavelength. A pivot point counter-bore 114 also formed in the top surface 110 is sized to receive a flex-bearing member. The counter-bore 114 defines an alignment region used to vertically align the flex bearing 128 with the tuning assembly base 120. Three threaded screw holes 116 are formed in the top surface. Each of the three screw holes are spaced apart from each other and centered equi-distant from a center point of the pivot point counter-bore 114. Two of the screw holes 116 are closer to each other on one side of the pivot point counter-bore 114, and the other screw hole 112 (hidden behind upstanding wall 108) is disposed on a generally opposite side of the counter-bore 114. As explained more fully below, the three screws serve as a rotational alignment guide during coarse tuning of the laser (not shown).

The laser tuning assembly 104 will be described with reference to FIGS. 2-3. FIG. 2 is an illustrative perspective exploded view of the laser tuning assembly 104 in accordance with one embodiment of the invention. FIG. 3 is an illustrative perspective non-exploded view of the assembly 104 which shows how its various parts fit together. The laser tuning assembly 104 includes a tuning assembly base 120, also referred to herein as a first base, a movable arm 122, a piezoelectric device 124 and a cylindrical flex bearing 128. Three arcuate grooves 126 are disposed concentrically about a center axis of the flex bearing 128. Two arcuate screw-receiving alignment grooves 126 are formed through the base 120 generally on one side of the flex bearing 120 and another screw-receiving alignment groove 126 is formed through the base on a generally opposite side of the flex bearing 128. Screws 162 and arcuate guides 126 serve as a rotational alignment guide during alignment of assembly 104 within the top recessed region 106.

The tuning assembly base 120 includes on one side thereof an upstanding fine tuning anchor region 130 which includes an inward facing wall 132 which serves as a fixed-position anchor surface against which the piezoelectric device 124 can exert a force during fine tuning operations. The base 120 has a cylindrical opening 134 formed therein, which is sized to snuggly receive a bottom portion of the cylindrical flex bearing 128. A pin-receiving hole 134 formed in an outer sidewall 136 of the base 120 extends through to the cylindrical opening 134. A corresponding hole 138 formed in a bottom portion of the flex bearing 128 is aligned with the hole 134 such that a pin 140 can be inserted through a washer 142 into the aligned holes 134 and 138 so as to secure the flex bearing 128 in a fixed rotational position relative to the tuning assembly base 120.

The movable fine tuning laser tuning arm 122 defines a cylindrical opening 144 sized to snuggly receive an upper portion of the flex bearing 128. The fine tuning arm 122 has a generally elongate shape in which one end portion includes two clamping halves 146, 148 and an opposite end portion defines an inward facing wall 150 disposed opposite the inward facing wall 132 of the base 120. The inward facing wall 150 of the fine tuning arm 122 serves as a movable surface against which a piezoelectric device 124 can exert a force during fine tuning operations. The top portion of the flex bearing 128 fits through the cylindrical opening 144 in the fine tuning arm 122. A screw-receiving hole 152 is formed through the clamping halves 146, 148, and a screw 154 is inserted through a washer 156 into the hole 152 in order to cause the clamping halves 146, 148, to squeeze more tightly together, thereby clamping the top portion of the flex bearing 128 in a fixed position relative to the arm 122.

As best shown in FIG. 3, after assembly, the piezoelectric device 124 is disposed between the fixed-position inward facing anchor wall 132 of the base 120 and a movable inward facing wall 150 of the arm 122. A bottom portion of the flex bearing is fixed relative to the base 120, and a top portion of the flex bearing is fixed relative to the fine tuning arm 122. Hence, an axial center line of the flex bearing 128 serves as a pivot point about which the arm rotates, slightly, during fine tuning operations, in response to expansion and contraction of the piezoelectric device 124. A portion of the base 120 opposite the upstanding anchor region 130 serves as a guide surface 158 over which the arm 122 can move, slightly, during fine tuning operations.

A portion 151 of the fine tuning arm 122 having the inward facing wall 150 protrudes outwardly beyond the base 120 (first base). As explained more fully below, a reflective component (not shown) is operatively secured to this outwardly protruding portion 151, such that rotational arm movement about the pivot point induced by actuation of the piezoelectric device 124, in turn, causes adjustment of the position of the reflective surface, and thereby causes adjustment of the wavelength at which the laser lases.

In one embodiment, the flex-bearing is implemented using bearings provided by the C-Flex Bearing Company of Frankfort, N.Y. In one embodiment, the bearing comprises two stainless steel sleeves held in position by three leaf springs on two planes. Top and bottom portions of the flex bearing can be rotated in different directions relative to one another without changes in axial or radial dimensions. This characteristic is highly desirable in high-accuracy tuning requirements laser devices. There is no contact between the sleeves, eliminating friction. The springs provide the pivotal action which is inherently self centering. That is, the leaf springs urge the top and bottom portions to neutral positions relative to each other in the absence of a twisting torque force. C-Flex Bearings are constructed utilizing flat springs which are locked and crossed at a 90 degree angle, encapsulated in a cylindrical housing.

Referring once again to FIG. 1, the laser and tuning assembly 104 is inserted into the top recessed region 106 of the block 102 (second base), such that a bottom portion of the flex bearing 128 is rotatably positioned within the pivot point counter-bore 114. A portion of the movable laser tuning arm 122 includes a downward depending support structure 160 to which a mirror (not shown) of an external cavity laser is operably coupled. The support structure 160 depends downwardly through hole 112 into a lower recess (not shown), which is described below. Once the assembly 118 is placed within the top recessed region 106, screws 162 are inserted through washers into the three threaded screw holes 116. The tuning assembly 104 is rotated about the pivot point which extends through the vertical axis of the flex bearing 128 until the mirror operably coupled to the support structure 160 is aligned so that the laser (not shown) is tuned at a desired center frequency. During such center-frequency tuning movement, the screws 162 are only partially tightened so that the assembly 104 and the flex bearing 128 can be rotated about the pivot point. The arcuate grooves 126 are sized to permit a range of rotationally movement of the assembly 118 sufficient for center-frequency tuning. Once the assembly 104 is positioned such that the laser is tuned to the desired center frequency, the screws 162 are tightened, securing the tuning assembly base 120 into a fixed position relative to the foundation block 102.

Thus, the vertical axis of the flex bearing 128 serves as the pivot point. The counter-bore 114 serves to align the assembly 104. The partially inserted screws 162 and arcuate grooves 126 serve as a coarse alignment guide. During coarse alignment, the top and bottom portions of the flex bearing 128 are in a neutral position, since no torque force is exerted upon the flex bearing.

FIG. 4 is a top perspective view showing the laser tuning assembly 104 secured within the top recessed region 106 of the foundation block 102. Note the downward depending support structure 160 extending through hole 112. It will be appreciated that the downward depending support structure 160, in essence, is a portion of protruding arm portion 151. Also note that screws 162 are tightened so that the tuning assembly base 120 cannot move relative to the foundation 102.

FIG. 5 is an illustrative partially exploded top perspective view showing a bottom side of the foundation block 102 and a laser diode block 165, which is to be secured within a bottom recessed region 166 of the foundation block 102. Screws 172 are inserted through washers 174 to secure the diode laser block 165. A dispersion medium 168 is secured within the bottom recessed region 166. A reflective surface 170 also is disposed within the bottom recessed region 166.

The reflective surface is operably coupled to a support structure 160 that is secured to the laser tuning arm 122. Thus, the reflective surface 170 is movable relative to the diode block 165 and the dispersion medium 168. Movement of the reflective surface 170 permits fine tuning of the operating frequency of an external cavity laser implemented using the diode block 165, the dispersion medium 168 and the reflective surface 170.

FIG. 6 is an illustrative bottom perspective view of an external cavity laser assembly in accordance with an embodiment of the invention. The diode blocks 165 and the dispersion medium 168 are secured in fixed positions relative to each other within the bottom recessed region 166 of the foundation block 102. The reflective surface 170, a prism in one embodiment, is movable relative to the positions of the dispersion medium, a grating in a preferred embodiment 168 and the diode 165, since it is operably coupled to the movable laser tuning arm 122.

Thus, coarse adjustment of the center frequency of the external cavity laser is achieved by rotatably positioning the overall laser tuning assembly 104 such that the reflective surface 170 is positioned so that the laser has a desired center frequency. Fine positioning of the reflective surface 170 is achieved by actuation of the piezoelectric device 124 which moves the downward depending support structure 160, which is operably coupled to the reflective surface 170. It will be appreciated that the same pivot point is used during both coarse and fine tuning. During coarse tuning, the entire laser tuning assembly 104 is rotated about the vertical axis of the flex bearing 128 which has a bottom portion rotatably positioned within the pivot point counter bore 114. During fine tuning, the tuning assembly base 120 is fixed, and only the movable laser tuning arm 122 can move in response to actuation of the piezoelectric device 124. The tuning arm 122 also rotates about the vertical axis of the cylindrical flex bearing 128.

It will be understood that the foregoing description and drawings of preferred embodiment in accordance with the present invention are merely illustrative of the principles of this invention, and that various modifications can be made by those skilled in the art without departing from the scope and spirit of the invention.

The invention claimed is:

1. A laser tuning apparatus comprising:
   a first base;
   a fine tuning arm;
   a flex bearing including top and bottom portions rotatable at least partially in opposite directions relative to one another;
   wherein a bottom portion of flex bearing is secured to the base;
   wherein a top portion of the flex bearing is secured to the arm; and
   a piezoelectric device with a portion operatively secured to the base and another portion operatively secured to the arm.

2. The laser tuning apparatus of claim 1 further including:
   a reflective surface secured to the arm.

3. The laser tuning assembly of claim 1 further including:
   a second base securable in a fixed relation to the first base; and
   a reflective surface secured to the arm.

4. The laser tuning apparatus of claim 1 further including:
a second base securable in a fixed relation to the first base; and
a reflective surface secured to the arm; and
a dispersive element secured to the second base.

5. The laser tuning apparatus of claim 1 further including:
a second base securable in a fixed relation to the first base;
wherein the second base defines a pivot surface contoured for rotational alignment with the bottom portion of flex bearing for coarse rotational alignment of the first base relative to the second base.

6. The laser tuning apparatus of claim 1 further including:
a second base securable in a fixed relation to the first base;
wherein the second base defines a pivot surface contoured for alignment with the bottom portion of flex bearing for coarse rotational alignment of the first base relative to the second base;
a reflective surface secured to the arm; and
a dispersive element secured to the second base.

7. The laser tuning apparatus of claim 1 further including:
a second base that includes a first side and an oppositely facing second side and defining a hole extending from the first side to the second side;
wherein the second base further defines a pivot surface in the first side thereof contoured for alignment with the bottom portion of flex bearing for coarse rotational alignment of the first base relative to the second base; and
wherein a portion of the tuning arm extends at least partially through the hole in the second base.

8. The laser tuning apparatus of claim 1 further including:
a second base that includes a first side and an oppositely facing second side and defining a hole extending from the first side to the second side;
wherein the second base further defines a pivot surface in the first side thereof contoured for alignment with the bottom portion of flex bearing for coarse rotational alignment of the first base relative to the second base; and
wherein a portion of the tuning arm extends at least partially through the hole in the second base; and
further including:
a reflective surface secured to the arm.

9. The laser tuning apparatus of claim 1 further including:
a second base that includes a first side and an oppositely facing second side and defining a hole extending from the first side to the second side;
wherein the second base further defines a pivot surface in the first side thereof contoured for alignment with the bottom portion of flex bearing for coarse rotational alignment of the first base relative to the second base; and
wherein a portion of the tuning arm extends at least partially through the hole in the second base; and
further including:
a reflective surface secured to the arm; and
a dispersive element secured to the second base.

10. A laser tuning apparatus comprising:
a foundation base;
a tuning assembly base;
a fine tuning arm;
a flex bearing including top and bottom portions that can be rotated at least partially in opposite directions relative to one another;
wherein a bottom portion of the flex bearing is secured to the tuning assembly base;
wherein a top portion of the flex bearing is secured to the fine tuning arm;
a coarse rotational alignment guide that guides rotational alignment of the tuning assembly base about a vertical axis of the flex bearing when the flex bearing is vertically aligned within a prescribed alignment region of the tuning assembly base; and
a piezoelectric device with one end secured to the tuning assembly base and another end secured to the fine tuning arm.

11. The apparatus of claim 10,
further comprising a flex bearing alignment guide defined by a counter-bore in the foundation base, and which is sized to receive the bottom portion of the flex bearing.

12. The apparatus of claim 10,
wherein the tuning assembly base defines a counter-bore sized to receive the flex bearing and portion, thereby defining the prescribed alignment region.

13. The apparatus of claim 10 further including:
a reflective surface secured to the arm.

14. The apparatus of claim 10 further including:
a reflective surface secured to the arm; and
a dispersive element secured to the second base.

15. A tunable laser including:
a first base;
a second base;
a fine tuning arm;
a piezoelectric device;
a flex bearing aligned with a pivot axis and including top and bottom portions that can be rotated at least partially in opposite directions relative to one another; and
a laser cavity including,
    a reflecting surface;
    a dispersive surface;
    a gain medium;
wherein a bottom portion of the flex bearing is secured to the base;
wherein a top portion of the flex bearing is secured to the arm; and
wherein one portion of the piezoelectric device is operatively connected to the first base and another portion of the piezoelectric device is operatively connected to the arm;
wherein the first base is securable in a fixed relation to the first base;
wherein the reflecting surface is secured to the arm;
wherein the dispersive medium is secured to the second base; and
wherein the gain medium is secured to the second base.

16. The tunable laser of claim 15,
wherein the second base includes a first side and an oppositely facing second side and includes a hole extending from the first side to the second side;
wherein the first base is securable to the first side of the second base;
wherein the reflecting surface is secured to the arm;
wherein a portion of the arm extends at least partially through the hole;
wherein the dispersive medium is secured to the second side of the second base; and
wherein the gain medium is secured to the second side of the second base.

17. The tunable laser of claim 15,
wherein the second base defines a pivot surface contoured for rotational alignment with the bottom portion of flex bearing for coarse rotational alignment of the first base relative to the second base.

18. The tunable laser of claim 15,
wherein the pivot axis is disposed for mode-hop-free tuning of the laser cavity.

19. A tunable laser comprising:
(A) a foundation including a first side and an oppositely facing second side and including a hole extending from the first side to the second side;
(B) a tuning assembly including a base, a fine tuning arm and a rotational flex bearing disposed adjacent the first side of the foundation;
wherein the base is disposed adjacent to the first side of the foundation;
wherein one end of the flex bearing is secured to the base;
wherein the other end of the flex bearing is secured to the fine tuning arm;
wherein a portion of the fine tuning arm extends at least partially into the hole;
(C) an external cavity laser including a gain medium, a dispersion medium and a reflective member disposed adjacent to the second side of the foundation;
wherein the gain medium and the dispersion medium grating are secured in a fixed relation relative to the each other;
wherein the reflective member is secured to the portion of the arm extending into the hole; and
(D) a piezoelectric device with one end secured to the base and another end secured to the arm.

20. The laser tuning apparatus of claim 1 wherein the flex bearing top and bottom portions are rotatable in opposite directions relative to one another without changes in axial or radial dimensions.

21. The laser tuning apparatus of claim 1, wherein the flex bearing includes two sleeves held in position by three springs.

* * * * *